United States Patent
Hashimoto et al.

(10) Patent No.: US 11,980,002 B2
(45) Date of Patent: May 7, 2024

(54) HOLDING DEVICE, CURRENT MONITORING DEVICE, AND POWER SUPPLY DEVICE

(71) Applicant: DENSO TEN Limited, Kobe (JP)

(72) Inventors: Kazuya Hashimoto, Kobe (JP); Hitoshi Enomoto, Kobe (JP)

(73) Assignee: DENSO TEN Limited, Kobe (JP)

( * ) Notice: Subject to any disclaimer, the term of this patent is extended or adjusted under 35 U.S.C. 154(b) by 173 days.

(21) Appl. No.: 17/678,537

(22) Filed: Feb. 23, 2022

(65) Prior Publication Data
US 2023/0156952 A1    May 18, 2023

(30) Foreign Application Priority Data
Nov. 18, 2021  (JP) .................................. 2021-188078

(51) Int. Cl.
*H05K 7/14* (2006.01)
*G01R 15/14* (2006.01)
*H05K 1/18* (2006.01)

(52) U.S. Cl.
CPC .......... *H05K 7/1401* (2013.01); *G01R 15/146* (2013.01); *H05K 1/181* (2013.01); *H05K 7/1427* (2013.01)

(58) Field of Classification Search
CPC .... H05K 7/1401; H05K 1/181; H05K 7/1427; G01R 15/146; G01R 31/382; G01R 1/203; Y02E 60/10

USPC ......................................................... 324/426
See application file for complete search history.

(56) References Cited

U.S. PATENT DOCUMENTS

| | | | |
|---|---|---|---|
| 11,346,863 B2 * | 5/2022 | Wandres | G01R 19/0092 |
| 2017/0003322 A1 * | 1/2017 | Nakamura | G01R 15/146 |
| 2019/0312383 A1 * | 10/2019 | Watanabe | H05K 5/0069 |
| 2021/0375510 A1 * | 12/2021 | Kim | H01C 1/14 |

FOREIGN PATENT DOCUMENTS

| | | |
|---|---|---|
| JP | 2017-015588 A | 1/2017 |
| KR | 20120020969 A * | 3/2012 |
| KR | 101407664 B1 * | 6/2014 |

* cited by examiner

*Primary Examiner* — Huy Q Phan
*Assistant Examiner* — Haidong Zhang
(74) *Attorney, Agent, or Firm* — Oliff PLC

(57) ABSTRACT

A holding device, includes: a holding portion configured to hold a shunt resistor; a spacer portion extending from the holding portion and abutting on a front surface of a substrate on which a monitoring unit configured to monitor a current value of a current flowing through the shunt resistor is mounted; and an engaging portion extending from the holding portion and having an engaging claw to be engaged with a back surface of the substrate. The spacer portion separates the holding portion and the substrate from each other such that a connection portion which electrically connects the shunt resistor and the monitoring unit is visible.

14 Claims, 5 Drawing Sheets

HOLDING DEVICE, CURRENT MONITORING DEVICE, AND POWER SUPPLY DEVICE

CROSS-REFERENCE TO RELATED APPLICATIONS

This application is based upon and claims the benefit of priority from prior Japanese patent application No. 2021-188078, filed on Nov. 18, 2021, the entire contents of which are incorporated herein by reference.

TECHNICAL FIELD

The present invention relates to a holding device, a current monitoring device, and a power supply device.

BACKGROUND ART

There has been proposed a current detection device including a unit metal member through which a current to be measured flows, voltage terminal portions which acquire a voltage signal from the unit metal member, and a holding member that holds a plurality of the unit metal members in parallel (for example, JP-A-2017-15588). In this device, the plurality of unit metal members are sandwiched between the holding member and a substrate on which a wiring pattern is formed, and the voltage terminal portions of the unit metal member are connected to the wiring patterns of the substrate.

SUMMARY OF INVENTION

Technical Problem

When the unit metal member such as a shunt resistor is connected to the wiring pattern of the current detection device, a connection failure may occur. An object of the present invention is to provide a holding structure of a shunt resistor with which a connection portion can be easily recognized.

Solution to Problem

According to an aspect of the present invention, there is provided a holding device, including: a holding portion configured to hold a shunt resistor; a spacer portion extending from the holding portion and abutting on a front surface of a substrate on which a monitoring unit configured to monitor a current value of a current flowing through the shunt resistor is mounted; and an engaging portion extending from the holding portion and having an engaging claw to be engaged with a back surface of the substrate, in which the spacer portion separates the holding portion and the substrate from each other such that a connection portion which electrically connects the shunt resistor and the monitoring unit is visible.

Advantageous Effects of Invention

According to the aspect of the present invention, it is possible to provide a holding structure of a shunt resistor with which the connection portion can be easily recognized.

DESCRIPTION OF EMBODIMENTS

Hereinafter, embodiments of the present invention will be described with reference to the drawings.

First Embodiment

Figure 1:
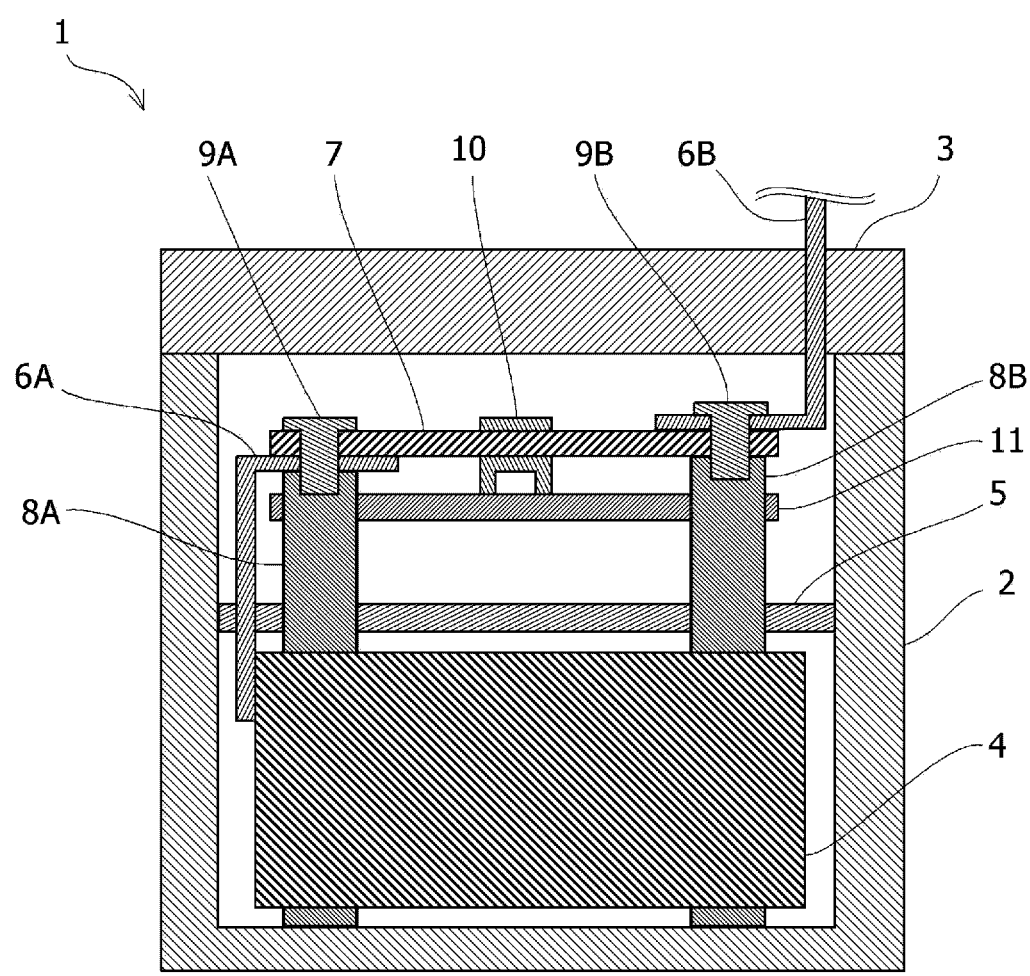
FIG. 1 is a schematic cross-sectional view of a power supply device including a shunt resistor and a holding device for the shunt resistor.

FIG. 1 is a schematic cross-sectional view of a power supply device including a shunt resistor and a holding device for the shunt resistor. The power supply device (battery) 1 illustrated in FIG. 1 includes a housing 2, a lid 3, a battery pack 4, a cover 5, bus bars 6A, 6B, a shunt resistor 7, bosses 8A, 8B, bolts 9A, 9B, a holding device 10, and a substrate 11. The power supply device 1 is, for example, a power supply for supplying electric power to an in-vehicle device such as a navigation device or an audio device, but is not limited to the examples.

The housing 2 and the lid 3 are packages that accommodate the battery pack 4. The battery pack 4 is, for example, a secondary battery such as a lead storage battery, but the power storage method is not particularly limited. The battery pack 4 is formed by connecting a plurality of battery cells so as to obtain a predetermined voltage or capacity, but the voltage, capacity, and the like thereof are not particularly limited. Further, the cover 5 is, for example, a resin cover for a purpose of waterproofing, and covers the battery pack 4 together with the housing 2.

The bus bars 6A, 6B are provided in an output current path of the battery pack 4, and are connected between the battery pack 4 and a load. The shunt resistor 7 is connected between the bus bars 6A, 6B. The shunt resistor 7 is connected to the substrate 11 via the holding device 10. The holding device 10 is a member provided for fixing the shunt resistor 7 to the substrate 11. The substrate 11 is, for example, a circuit substrate on which a monitoring unit (not shown) including a current sense amplifier and a microcomputer is mounted, and the monitoring unit is connected to the shunt resistor 7 via two lead pins. The current sense amplifier amplifies a voltage between two points of the shunt resistor corresponding to a value of a current flowing through the load, and outputs the amplified voltage to the microcomputer. The microcomputer monitors the current value based on a potential difference between the two points of the shunt resistor 7 amplified by the current sense amplifier. That is, the microcomputer performs A/D conversion on the received potential difference and performs processing according to a magnitude of the voltage after the conversion. In the present embodiment, the housing 2 for the battery pack 4 is also used as a housing for the substrate 11 and the shunt resistor 7, instead of providing a dedicated housing incorporating the substrate 11 and the shunt resistor 7 together with the housing 2 for the battery pack 4. As a result, the cost may be reduced.

Figure 2:
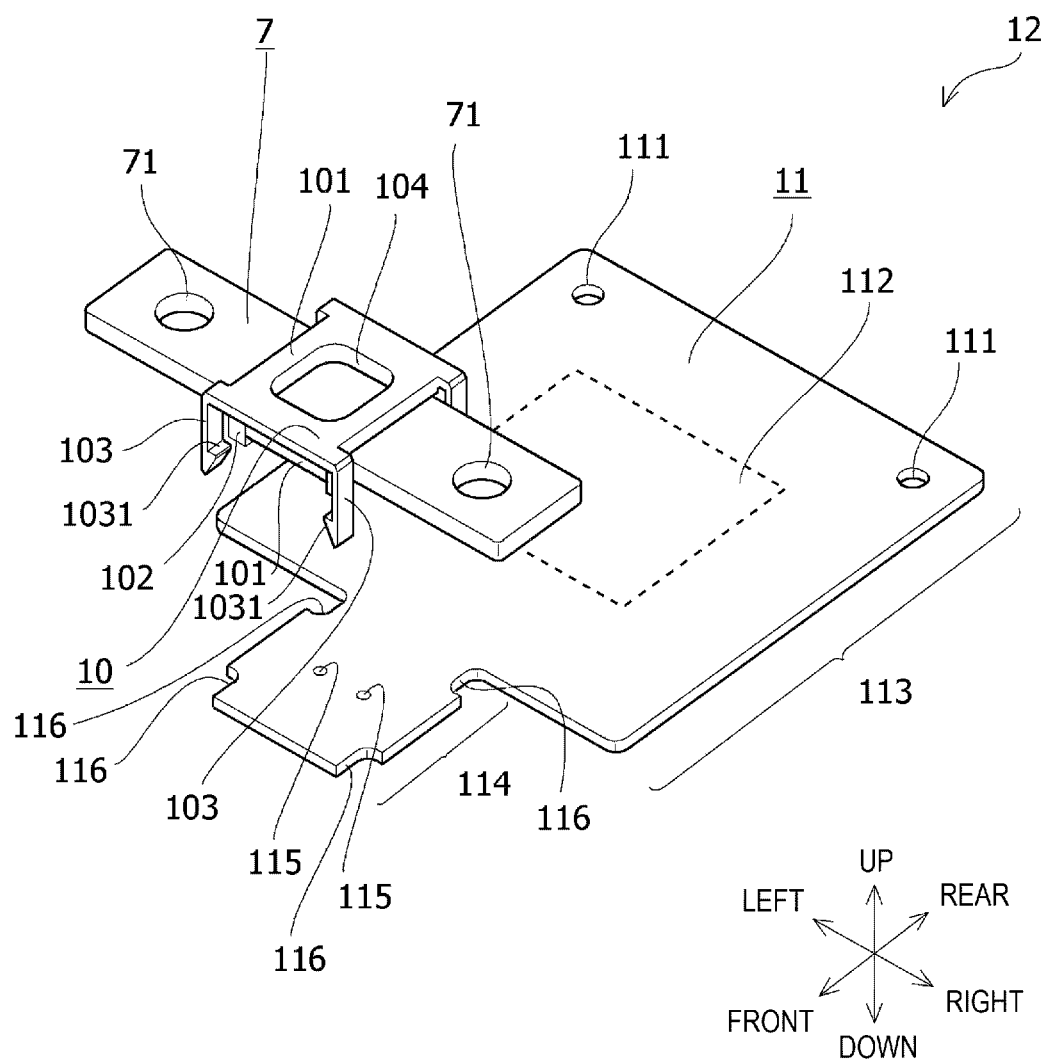
FIG. 2 is an exploded perspective view illustrating an example of a current monitoring device according to a first embodiment.
Figure 3:
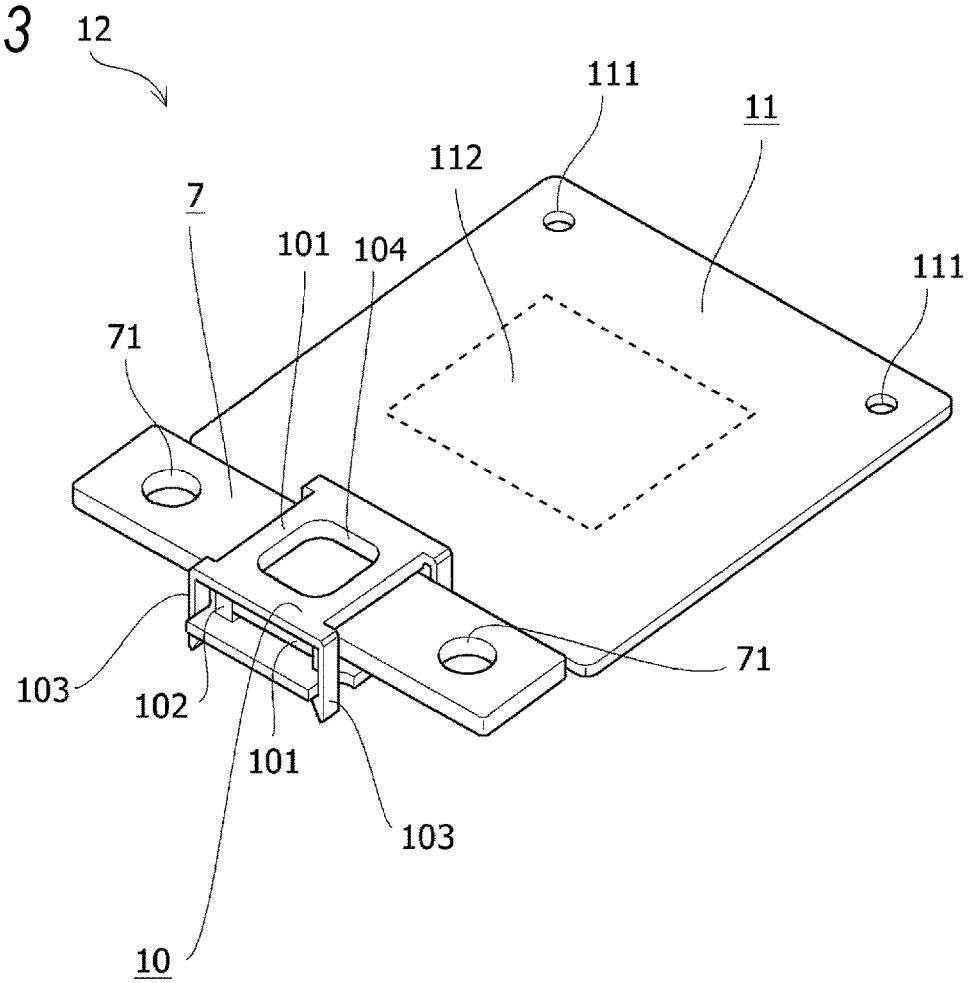
FIG. 3 is a perspective view illustrating an example of the current monitoring device according to the first embodiment.
Figure 4:
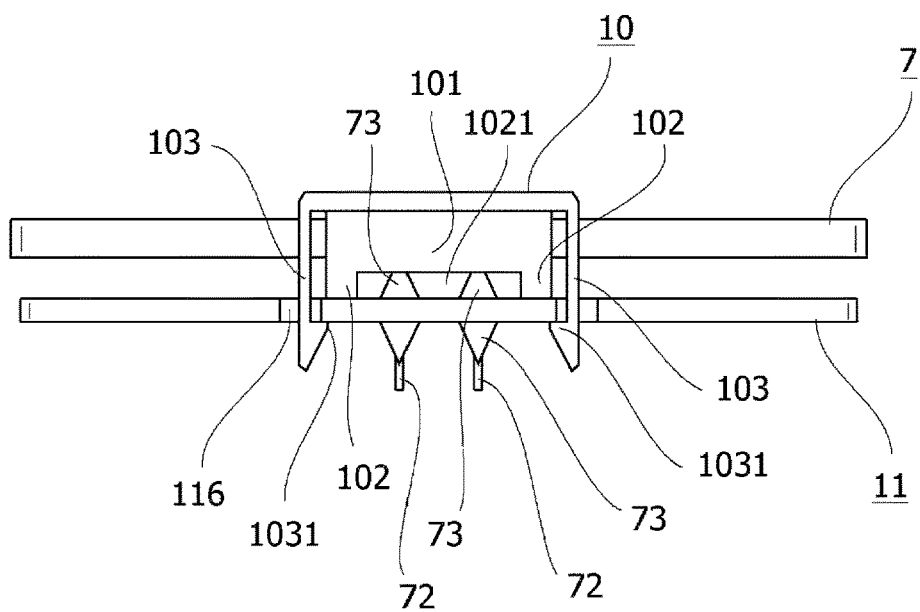
FIG. 4 is a front view illustrating an example of the current monitoring device according to the first embodiment.

FIG. 2 is an exploded perspective view illustrating an example of a current monitoring device according to a first embodiment. FIG. 3 is a perspective view illustrating an example of the current monitoring device according to the first embodiment. FIG. 4 is a front view illustrating an example of the current monitoring device according to the first embodiment. A direction in which a tongue piece portion 114 protrudes from a main body portion 113 of the substrate 11 to be described later, is referred to as front for the sake of convenience, and the description will be made based on front, rear, left, right directions illustrated in FIG. 2. A current monitoring device 12 includes the shunt resistor 7, the holding device 10, and the substrate 11. The shunt resistor 7 has through holes 71 into which the bolts 9A, 9B (not shown) for connecting the bus bars 6A, 6B (not shown) and the bosses 8A, 8b (not shown) can be inserted. A female screw may be provided inside the through hole 71. As shown in FIG. 4, the shunt resistor 7 includes two lead pins 72 protruding toward the substrate 11. The lead pins 72 are fixed to the substrate 11 by, for example, soldering. In FIG. 4, the lead pins 72 of the shunt resistor 7 are connected to the substrate 11 by solder portions 73 formed on front and back surfaces of the substrate 11.

The holding device 10 is formed of, for example, a resin, and includes a holding portion 101 for holding the shunt resistor 7, and spacer portions 102 and engaging portions 103 for fixing the holding portion 101 to the substrate 11. The holding portion 101 holds the shunt resistor 7 such that front and back sides of the shunt resistor 7 are sandwiched. In the present embodiment, the metal shunt resistor 7 and the holding device 10 are integrally formed by, for example, insert molding. The spacer portions 102 protrude from the holding portion 101 toward the substrate 11 and are abutted with the substrate 11. The engaging portions 103 protrude from four corners of the holding portion 101 toward the substrate 11. An engaging claw 1031 for engaging with an edge of the substrate 11 is provided on a front end side of the engaging portion 103. Further, the holding portion 101 has an opening portion (exposed portion) 104 through which a part of a surface (upper surface) of the shunt resistor 7 that is opposite to a surface (lower surface) facing the substrate 11 is exposed.

The substrate 11 has through holes 111 into which bolts for connecting to bosses (not shown) can be inserted. A monitoring unit 112 including, for example, a current sense amplifier and a microcomputer is mounted on the front surface or the back surface of the substrate 11. The current sense amplifier of the monitoring unit 112 is electrically connected to the shunt resistor 7. Further, the substrate 11 includes the main body portion 113 on which the monitoring unit 112 and the like are mainly mounted, and the tongue piece portion 114 which is a small piece protruding from the main body portion 113 to one side (front side in the example of FIG. 2). Two through holes 115 for inserting of the lead pins 72 of the shunt resistor 7 are formed in the tongue piece portion 114. The lead pins 72 of the shunt resistor 7 are inserted into the through holes 115, and are connected to the substrate 11 by the solder portions 73. Then, the shunt resistor 7 is electrically connected to the monitoring unit 112 mounted on the substrate 11. Notches 116 are formed at four corners of the tongue piece portion 114. The notches 116 are engaged with the engaging claws 1031 of the holding device 10, and the holding device 10 is connected to the substrate 11.

According to the spacer portions 102 of the holding device 10, the holding portion 101 and the front surface of the substrate 11 can be separated from each other such that connection portions (the lead pins 72 and the solder portions 73) that electrically connect the shunt resistor 7 and the monitoring unit 112 is visible. In the example of FIG. 4, the lead pins 72 and the solder portions 73 are visible without being blocked by the spacer portion 102 and the engaging portions 103 in a front view. In particular, the solder portions 73 formed on the front surface (upper surface) of the substrate 11 can be recognized through an opening 1021 formed between two spacer portions 102 in a front view. Specifically, since the opening 1021 is formed by the holding portion 101, the two spacer portions 102, and the substrate 11 in a front view, the solder portions 73 can be checked. The spacer portion 102 may be one or more columnar protruding portions, or may be, for example, a wall-shaped protruding portion extending in a predetermined direction such as a front-rear direction. That is, the spacer portion 102 is a protruding portion at least a part of which is opened such that the connection portions between the shunt resistor 7 and the monitoring unit 112 can be visually recognized. According to such spacer portions 102, the work of checking the connection failure is facilitated, and improvement of the quality may be expected.

According to the spacer portions 102 of the holding device 10, the substrate 11 and the shunt resistor 7 can be separated from each other, and transfer of heat from the shunt resistor 7 to the substrate 11 can be reduced. Further, according to the opening portion 104 of the holding device 10, the heat from the shunt resistor 7 can be efficiently dissipated. That is, breakage of the substrate or mounted components due to heat generation can be prevented. A shape of the opening portion 104 is not limited to a window-shaped hole that is surrounded by the periphery as long as the exposed portion through which at least a part of an upper side of the shunt resistor 7 is exposed is provided. By engaging the engaging claws 1031 with the notches 116 of the tongue piece portion 114, the holding device 10 facilitates positioning of an installation location of the shunt resistor 7, and the assembly of the shunt resistor 7. Further, the holding device 10 is fixed not to the main body portion 113 but to the tongue piece portion 114 of the substrate 11. In other words, the holding device 10 and the shunt resistor 7 are not mounted on the main body portion 113 on which components are mounted. Accordingly, components that are mounted on the main body portion 113 are not below the holding device 10 and the shunt resistor 7, and the degree of freedom of component arrangement in the main body portion 113 is increased.

Second Embodiment

Figure 5:
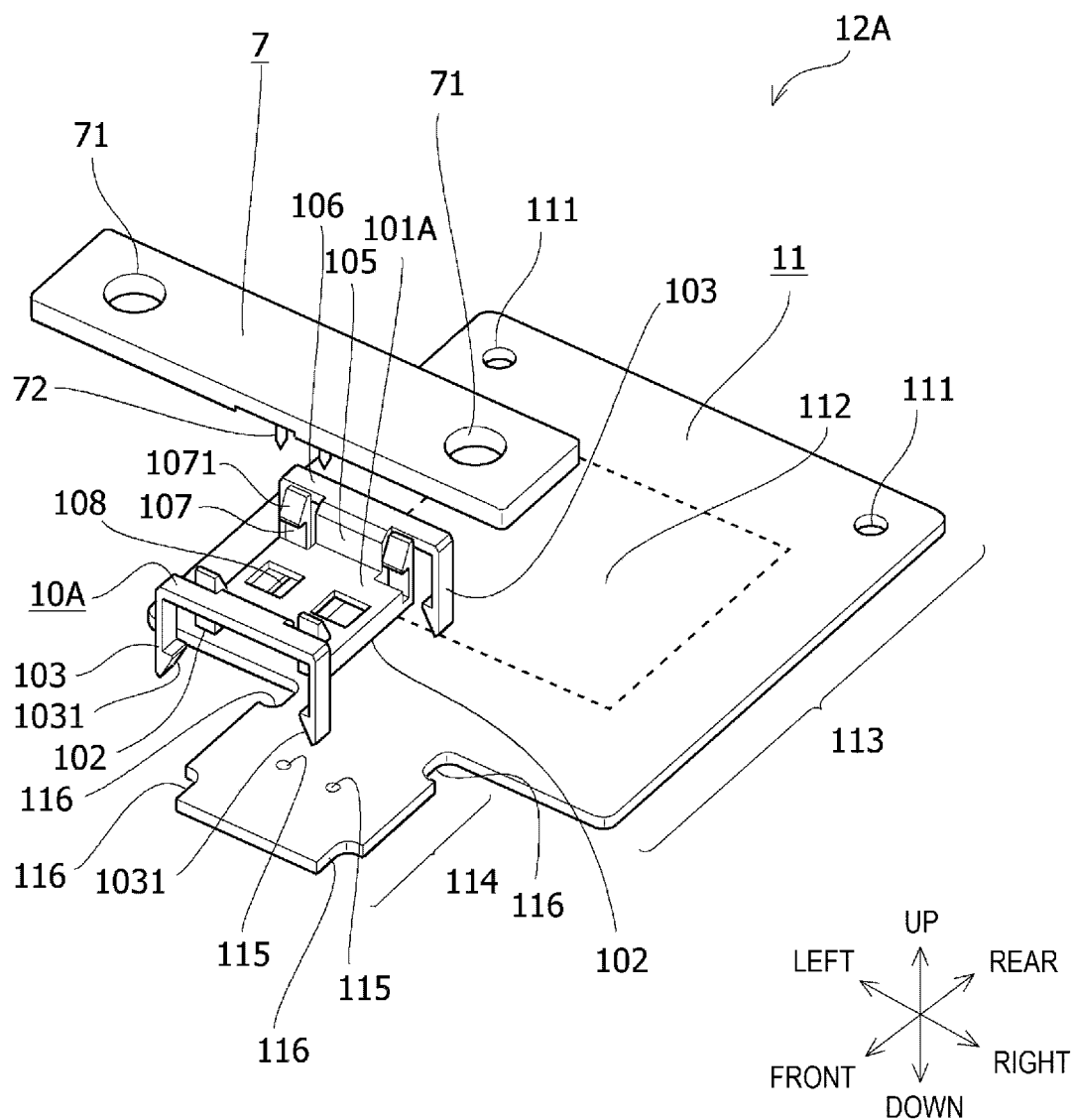
FIG. 5 is an exploded perspective view illustrating an example of a current monitoring device according to a second embodiment.
Figure 6:
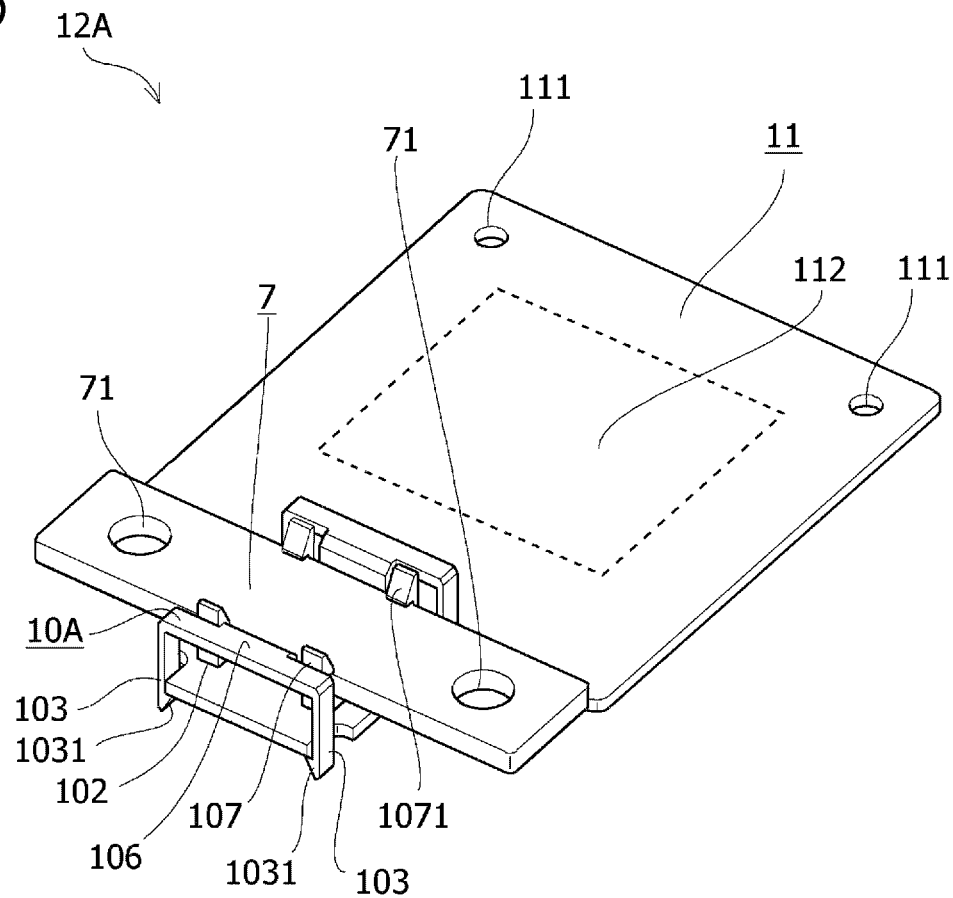
FIG. 6 is a perspective view illustrating an example of the current monitoring device according to the second embodiment.

FIG. 5 is an exploded perspective view illustrating an example of a current monitoring device according to a second embodiment. FIG. 6 is a perspective view illustrating an example of the current monitoring device according to the second embodiment. In the present embodiment, the same components as those of the above-described embodiment are denoted by the same reference numerals, and the description thereof will be omitted. A current monitoring device 12A includes the shunt resistor 7, a holding device 10A, and the substrate 11. The shunt resistor 7 and the holding device 10A according to the present embodiment are not integrally formed, but are formed by combining different members.

The holding device 10A according to the present embodiment includes a holding portion 101A whose upper surface is opened and on which the shunt resistor 7 can be placed, and the spacer portions 102 and the engaging portions 103 for fixing the holding portion 101A to the substrate 11. As in the above-described embodiment, the spacer portions 102 protrude from the holding portion 101A toward the substrate 11 and are abutted with the substrate 11. The engaging portions 103 are connected to the holding portion 101A via wall portions 105 and horizontal portions 106, and protrude from four corners of the horizontal portions 106 toward the substrate 11. The wall portions 105 are formed at front and rear of the holding portion 101A, respectively, and are erected upward. The horizontal portions 106 are formed at ends of the wall portions 105 respectively, and extend in a left-right direction. Then, the engaging portions 103 protrude downward from left and right end portions of each of the horizontal portions 106. An engaging claw 1031 for engaging with the edge of the substrate 11 is formed on a lower end side of the engaging portion 103. Further, the holding portion 101A includes locking portions 107 that protrude from four corners of the holding portion 101A in a direction (upward) opposite to the substrate 11 and that lock the shunt resistor 7. A locking claw 1071 for locking an edge of the shunt resistor 7 is formed on an upper end side of the locking portion 107. Further, the holding portion 101A has opening portions 108, through which the lead pins 72 of the shunt resistor 7 passes, at positions corresponding to the through holes 115 of the substrate 11 on a surface (lower surface) of the holding portion 101A facing the substrate 11.

In the present embodiment, when the holding device 10 is molded, it is not necessary to perform insert molding in combination with the shunt resistor 7. As compared with the first embodiment, an upper portion of the shunt resistor 7 is more largely exposed, and the heat dissipation efficiency is improved. Further, since the engaging portion 103 is provided on the holding portion 101A via the wall portion 105 and the horizontal portion 106, the engaging portion 103 is formed longer in the upper-lower direction and can be easily deformed, and the wall portion 105 and the horizontal portion 106 can also be deformed, so that a stress generated in the mounted component can be released.

In the present embodiment, according to the spacer portions 102 of the holding device 10A, the holding portion 101A and the front surface of the substrate 11 can also be separated such that the connection portions (the lead pins 72 and the solder portions 73) that electrically connect the shunt resistor 7 and the monitoring unit 112 can be visually recognized. According to the spacer portions 102 of the holding device 10A, the substrate 11 and the shunt resistor 7 can be separated from each other, and the transfer of heat from the shunt resistor 7 to the substrate 11 can be reduced. Further, the holding device 10A facilitates positioning of the installation location of the shunt resistor 7 by engaging the engaging claws 1031 with the notches 116 of the substrate 11.

Third Embodiment

Figure 7:
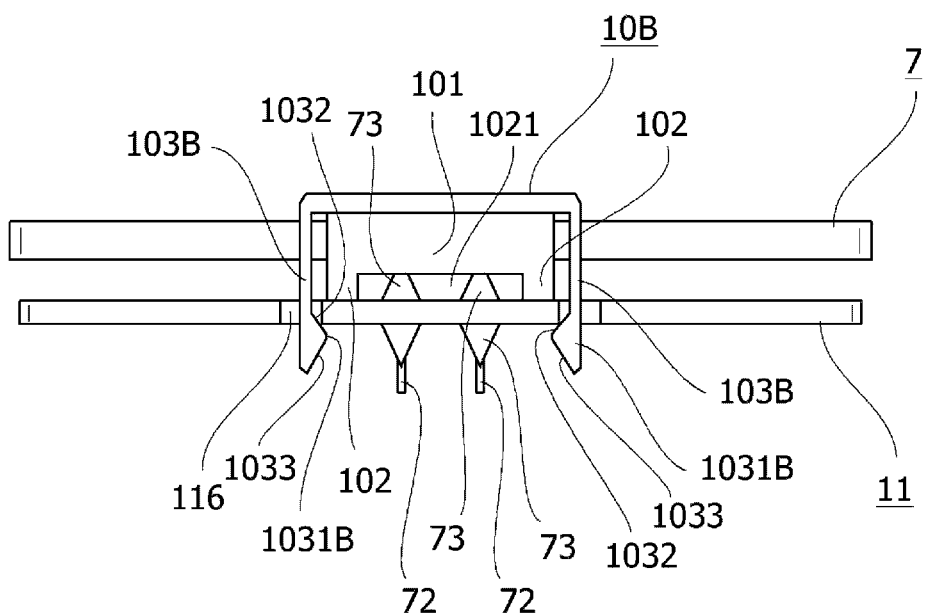
FIG. 7 is a front view illustrating an example of a current monitoring device according to a third embodiment.

FIG. 7 is a front view illustrating an example of a current monitoring device according to a third embodiment. In the present embodiment, the same components as those of the above-described embodiments are also denoted by the same reference numerals, and the description thereof will be omitted. A current monitoring device 12B includes the shunt resistor 7, a holding device 10B, and the substrate 11. In the holding device 10B according to the present embodiment, a shape of an engaging claw 1031B is different from those of the above-described embodiments. The shunt resistor 7 and the holding device 10B according to the present embodiment may be integrally molded, or may not be integrally molded.

The engaging claw 1031B of an engaging portion 103B includes a first inclined portion 1032 whose thickness increases toward an extending direction (lower side) in which the engaging portion 103B extends, and a second inclined portion 1033 which is located below the first inclined portion 1032 and whose thickness decreases toward the lower side. The first inclined portion 1032 can urge the holding device 10B in a direction, in which the holding device 10B is brought into close contact with the substrate 11, and can reliably fix the holding device 10B and the substrate 11. That is, in a state where the holding device 10B and the substrate 11 are engaged with each other, for example, when an external force such as vibration is applied to the substrate 11, a load can be reduced by a reaction force generated by the engaging claws 1031B, and particularly, the connection portions of the lead pins 72 between the holding device 10B and the substrate 11 can be protected.

In the present embodiment, according to the spacer portions 102 of the holding device 10B, the holding portion 101 and front surface of the substrate 11 can also be separated such that the connection portions (the lead pins 72 and the solder portions 73) that electrically connect the shunt resistor 7 and the monitoring unit 112 can be visually recognized. According to the spacer portions 102 of the holding device 10B, the substrate 11 and the shunt resistor 7 can be separated from each other, and the transfer of heat from the shunt resistor 7 to the substrate 11 can be reduced. Further, the holding device 10B facilitates positioning of the installation location of the shunt resistor 7 by engaging the engaging claws 1031B with the notches 116 of the substrate 11.

What is claimed is:
1. A holder comprising:
   a support surface that supports a bottom face of a shunt resistor having a pair of lead pins;
   an engaging claw configured to engage with a back surface of a substrate that is provided with a pair of through holes through which the pair of lead pins are inserted respectively, the substrate including the back surface and a front surface on which a monitoring circuit is mounted, the monitoring circuit being electrically connected to the pair of lead pins via connection portions at the pair of through holes, and the monitoring circuit being configured to monitor current flowing between the pair of lead pins; and
   a plurality of spacers that abut the front surface of the substrate and position the shunt resistor relative to the substrate so that the shunt resistor and the substrate are separated from each other, wherein
   an opening is provided between the plurality of spacers so that portions of the connection portions located between the front surface of the substrate and the holder are visible when the holder is viewed from a direction parallel to a plane of the substrate.
2. The holder according to claim 1, wherein
   the shunt resistor and the holder are integrally formed, and
   the holder includes an exposed portion through which at least a part of a side of the shunt resistor opposite to a surface facing the substrate is exposed.

3. The holder according to claim 1, wherein
the holder includes a locking portion including a locking claw for locking the shunt resistor.

4. The holder according to claim 1, wherein
the substrate includes a main body portion on which the monitoring circuit is mounted and a tongue piece portion which extends from the main body portion, and
the engaging claw is engaged with an edge of the tongue piece portion.

5. The holder according to claim 2, wherein
the substrate includes a main body portion on which the monitoring circuit is mounted and a tongue piece portion which extends from the main body portion, and
the engaging claw is engaged with an edge of the tongue piece portion.

6. The holder according to claim 3, wherein
the substrate includes a main body portion on which the monitoring circuit is mounted and a tongue piece portion which extends from the main body portion, and
the engaging claw is engaged with an edge of the tongue piece portion.

7. The holder according to claim 1, wherein
the engaging claw includes a first inclined portion whose thickness increases toward an extending direction in which the engaging claw extends, and a second inclined portion which is located on an extending direction side of the first inclined portion and whose thickness decreases toward the extending direction.

8. The holder according to claim 2, wherein
the engaging claw includes a first inclined portion whose thickness increases toward an extending direction in which the engaging claw extends, and a second inclined portion which is located on an extending direction side of the first inclined portion and whose thickness decreases toward the extending direction.

9. The holder according to claim 3, wherein
the engaging claw includes a first inclined portion whose thickness increases toward an extending direction in which the engaging claw extends, and a second inclined portion which is located on an extending direction side of the first inclined portion and whose thickness decreases toward the extending direction.

10. The holder according to claim 4, wherein
the engaging claw includes a first inclined portion whose thickness increases toward an extending direction in which the engaging claw extends, and a second inclined portion which is located on an extending direction side of the first inclined portion and whose thickness decreases toward the extending direction.

11. The holder according to claim 5, wherein
the engaging claw includes a first inclined portion whose thickness increases toward an extending direction in which the engaging claw extends, and a second inclined portion which is located on an extending direction side of the first inclined portion and whose thickness decreases toward the extending direction.

12. The holder according to claim 6, wherein
the engaging claw includes a first inclined portion whose thickness increases toward an extending direction in which the engaging claw extends, and a second inclined portion which is located on an extending direction side of the first inclined portion and whose thickness decreases toward the extending direction.

13. A current monitoring device comprising:
a shunt resistor having a pair of lead pins;
a substrate that is provided with a pair of through holes through which the pair of lead pins are inserted respectively, the substrate having a back surface and a front surface on which a monitoring circuit is mounted, the monitoring circuit being electrically connected to the pair of lead pins via connection portions at the pair of through holes, and the monitoring circuit being configured to monitor current flowing between the pair of lead pins; and
a holder including
a support surface configured to support a bottom face of the shunt resistor,
an engaging claw configured to engage with the back surface of the substrate, and
a plurality of spacers that abut the front surface of the substrate and position the shunt resistor relative to the substrate so that the shunt resistor and the substrate are separated from each other, wherein
an opening is provided between the plurality of spacers so that portions of the connection portions located between the front surface of the substrate and the holder are visible when the holder is viewed from a direction parallel to a plane of the substrate.

14. A power supply device comprising:
a battery pack including a secondary battery cell;
a shunt resistor that is electrically connected to the battery pack and has a pair of lead pins;
a substrate that is provided with a pair of through holes through which the pair of lead pins are inserted respectively, the substrate having a back surface and a front surface on which a monitoring circuit is mounted, the monitoring circuit being electrically connected to the pair of lead pins via connection portions at the pair of through holes, and the monitoring circuit being configured to monitor current flowing between the pair of lead pins;
a holder including
a support surface configured to support a bottom face of the shunt resistor,
an engaging claw configured to engage with the back surface of the substrate, and
a plurality of spacers that abut the front surface of the substrate and position the shunt resistor relative to the substrate so that the shunt resistor and the substrate are separated from each other, wherein
an opening is provided between the plurality of spacers so that portions of the connection portions located between the front surface of the substrate and the holder are visible when the holder is viewed from a direction parallel to a plane of the substrate; and
a housing configured to accommodate the battery pack, the shunt resistor, the substrate, and the holder.

* * * * *